(12) United States Patent
Jyo

(10) Patent No.: US 7,566,911 B2
(45) Date of Patent: Jul. 28, 2009

(54) LIGHT-EMITTING DIODE LAMP AND LIGHT-EMITTING DIODE DISPLAY DEVICE

(75) Inventor: Katsuaki Jyo, Hiroshima-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 27 days.

(21) Appl. No.: 11/313,933

(22) Filed: Dec. 22, 2005

(65) Prior Publication Data

US 2006/0138440 A1    Jun. 29, 2006

(30) Foreign Application Priority Data

Dec. 28, 2004   (JP)   .............................. 2004-379260

(51) Int. Cl.
*H01L 31/00* (2006.01)
(52) U.S. Cl. ................. 257/98; 257/100; 257/E33.066; 257/E33.067; 257/E33.072
(58) Field of Classification Search ................... 257/98, 257/99, 100, E33.056, E33.057, E33.058, 257/E33.059, E33.066, E33.067; 362/312, 362/555, 545, 800
See application file for complete search history.

(56) References Cited

U.S. PATENT DOCUMENTS

| 2002/0085390 A1* | 7/2002 | Kiyomoto et al. | ............ | 362/555 |
| 2002/0190262 A1* | 12/2002 | Nitta et al. | .................... | 257/99 |
| 2004/0037076 A1* | 2/2004 | Katoh et al. | ................ | 362/235 |
| 2004/0042212 A1* | 3/2004 | Du et al. | ...................... | 362/296 |

FOREIGN PATENT DOCUMENTS

| JP | 03-192290 | | 8/1991 |
| JP | 3-288479 | | 12/1991 |
| JP | 05121785 A | * | 5/1993 |
| JP | 07131074 A | * | 5/1995 |
| JP | 08264839 A | * | 10/1996 |
| JP | 11-154766 | | 6/1999 |
| JP | 11154766 A | * | 6/1999 |
| JP | 2001-345484 | | 12/2001 |
| JP | 2002223005 A | * | 8/2002 |
| JP | 2002270902 A | * | 9/2002 |
| JP | 2004-104077 | | 4/2004 |

* cited by examiner

*Primary Examiner*—Sue Purvis
*Assistant Examiner*—Leslie Pilar Cruz
(74) *Attorney, Agent, or Firm*—Morrison & Foerster LLP

(57) ABSTRACT

The light-emitting diode lamp has a light-emitting diode chip mounted on a cup-shaped mounting portion of a lead frame. The mounting portion is formed at one end of a lead portion of the lead frame. The light-emitting diode chip and the mounting portion are embedded in a convex shape lens made of a resin. The lead frame has a hood portion serving as a reflector. The hood portion downwardly reflects the outgoing beam of the light-emitting diode chip and also shields external incident light obliquely from the upper side. Thus, it is possible to increase the luminous efficiency in the downward direction, improve the visibility from the lower side and increase the luminous efficiency in the desired direction without any combination of complicated lens configurations.

11 Claims, 10 Drawing Sheets

# LIGHT-EMITTING DIODE LAMP AND LIGHT-EMITTING DIODE DISPLAY DEVICE

CROSS-REFERENCE TO RELATED APPLICATIONS

This nonprovisional application claims priority under 35 U.S.C. §119(a) on Patent Application No. 2004-379260 filed in Japan on 28 Dec. 2004, the entire contents of which are incorporated herein by reference.

BACKGROUND OF THE INVENTION

The present invention relates to light-emitting diode lamps and light-emitting diode display devices, which are used for, for example, LED (light-emitting diode) display boards for outdoor purpose. They are suitably used for a road information display of traffic information and so on, an outdoor display for advertisement and publicity, or a traffic signal and so on.

Conventionally, there has been an LED lamp as shown in FIG. 16. In the LED lamp, an LED chip 102 is mounted on a lead frame 101 and resin-molded to be embedded in a resin lens 103. The resin lens 103 has a curved surface 103A which is curved in a convex shape toward the light-emitting direction of the LED chip 102.

When the LED lamp shown in FIG. 16 is used for, for example, an outdoor LED display board, sunlight directly enters the LED lamp in the early morning or in the late afternoon since the irradiation angle of sunlight is small. As the result, there is a phenomenon that the unlit LED lamp looks as if it were lighting. The phenomenon disadvantageously reduces the contrast ratio between the lighting LED lamp and the unlit LED lamp, and therefore it becomes sometimes difficult to see the LED display board. The phenomenon resembles misrecognition of the traffic signal due to the west sun, and this significantly degrades the display quality of the LED display board that constitutes the electronic display board or the like.

The phenomenon in the conventional LED lamp is described more in detail with reference to FIG. 18. The irradiation angle of sunlight rays is small 111a and 111b in the early morning or in the late afternoon. If sunlight rays (e.g., west sun light) are incident on the resin lens 103 as shown in FIG. 18, then the light rays are refracted at a curved surface 103A of the resin lens 103. Thereby, their traveling directions of light come closer to normal lines L101 and L102 at incident points P101 and P102, respectively. The sunlight rays 111a and 111b are incident on an LED chip mounting portion 101A of the lead frame 101 due to the refraction, and reflected thereon. Then, the sunlight rays 111a and 111b are incident on and refracted at the curved surface 103A of the resin lens 103 at an incident angle roughly close to that of the emission light of the LED chip 102, and thereafter emitted at an angle close to that of an outgoing beam axis J101. This is the phenomenon that the unlit LED lamp looks as if it were lighting.

Next, FIG. 17 shows another prior art example. The prior art example has a structure similar to that of the foregoing prior art example, where the LED chip 102 is mounted on the lead frame 101. However, this prior art example differs from the foregoing prior art example in having upper and lower curved surfaces 104A and 104B of different configurations.

In this prior art example, the curved surface 104A and the curved surface 104B are located on one side and the other side respectively with relation to a plane that does not cross the center of the light-emitting surface of the LED chip 102. This makes it possible to prevent the concentration of the outgoing beam of the light-emitting diode chip on the plane that penetrate the center of the light-emitting surface, and therefore prevent the occurrence of a distorted light emission peak on the front surface. Thereby, it is possible to avoid a phenomenon that the light emission intensity is sharply reduced only when the viewpoint is slightly shifted from the front surface.

However, this prior art example has consumed a lot of cost and time in production because complicated simulations and trial evaluations must be repeated for an appropriate lamp configuration every time the dimension of lamp is changed.

As described above, the firstly-stated prior art example needs to examine a place where the LED display board is installed because it cannot be installed in the place exposed to the west sun or must be installed there with the screen of the LED display board inclined downward. Therefore, it is sometimes impossible to apply the firstly-stated prior art to the display utilized for traffic safety particularly in the traffic information board or the like, which display is one of the original purposes of the firstly-stated prior art.

In the secondly-stated prior art example, the combination lens of the upper and lower portions having different curvatures repeatedly has required the complicated simulations and the trial evaluations for an appropriate configuration of lamp every time the dimension thereof is changed, which have consumed a lot of cost and time for developing new models.

JP 2004-104077 A and JP H11-154766 A are given as the prior art reference documents.

SUMMARY OF THE INVENTION

An object of the present invention is to provide a diode lamp and a light-emitting diode display device capable of being utilized for display by increasing the luminous efficiency in the desired direction without any combination of complicated lens configurations.

In order to solve the above problems, the present invention provides a light-emitting diode lamp comprising:

a lead frame having a lead portion and a mounting portion formed at one end of the lead portion in a direction in which the lead portion extends;

a light-emitting diode chip mounted on the mounting portion; and a resin portion through which light emitted from the light-emitting diode chip is transmitted, wherein a directional characteristic peak of an outgoing beam emitted from the resin portion is not located on an extension axis of the lead portion in the direction in which the lead portion extends.

In the light-emitting diode lamp of the present invention, the directional characteristic peak of the outgoing beam emitted from the resin portion is not located on the extension axis in the direction in which the lead portion extends. That is, the directional characteristic peak of the outgoing beam deviates from the direction in which the lead portion extends. Therefore, the luminous efficiency in the prescribed direction can be improved by concentrating the outgoing beam from the light-emitting diode chip in the prescribed direction (e.g., downward) This can be utilized for display.

In one embodiment of the present invention, the mounting portion of the lead frame is inclined with respect to the lead portion so that a normal line of a light-emitting surface of the light-emitting diode chip is inclined with respect to the extension axis of the lead portion.

According to the light-emitting diode lamp of the embodiment, the luminous efficiency in the prescribed direction can be improved by concentrating the outgoing beam from the light-emitting diode chip in the prescribed direction (e.g., downward), which can be utilized for display. Moreover, merely processing and changing the lead frame mounting portion is able to cope with various lamp dimensions without any combination of complicated lens configurations.

In one embodiment of the present invention, the light-emitting diode lamp further comprises a reflector which is placed along the extension axis of the lead portion and whose dimension in the direction of the extension axis is changed around the extension axis.

In the light-emitting diode lamp of the embodiment, the reflector is placed along the extension axis of the lead portion, and the dimension of the reflector in the direction of the extension axis changes around the extension axis. Since the outgoing beam from the light-emitting diode chip is reflected toward the prescribed direction (e.g., downward) by the reflector, the luminous efficiency in the prescribed direction can be improved. Moreover, external incident light is shielded by the reflector in the embodiment. This makes it possible to avoid reflecting extraneous light forward at the light-emitting diode chip or the mounting portion of the lead frame, and therefore, to prevent the misrecognition that the lamp looks as if it were lighting during the unlit period.

In one embodiment of the present invention, the lamp has a plurality of light-emitting diode chips, and the plurality of light-emitting diode chips are arranged in a direction perpendicular to a plane that contains the extension axis of the lead portion and a parallel line of the normal line of the light-emitting surface of the light-emitting diode chip.

According to the light-emitting diode lamp of the embodiment, the plurality of light-emitting diode chips are each arranged in the above-mentioned direction, and therefore, luminance can be improved while preventing display nonuniformity and misrecognition. Moreover, a multicolor light-emitting diode lamp can be realized by making the plurality of light-emitting diode chips emit light rays of mutually different wavelengths In one embodiment of the present invention, the lamp has a plurality of light-emitting diode chips, and the plurality of light-emitting diode chips are each arranged along a direction in which the reflector extends around the extension axis.

According to the light-emitting diode lamp of the embodiment, the plurality of light-emitting diode chips are each arranged in the above-mentioned direction, and therefore, luminance can be improved while preventing display nonuniformity and misrecognition. Moreover, a multicolor light-emitting diode lamp can be realized by making the plurality of light-emitting diode chips emit light rays of mutually different wavelengths.

In one embodiment of the present invention, the lead frame undergoes a black surface treatment.

In the embodiment, since the light-emitting diode chip is mounted on the lead frame mounting portion that has undergone the black surface treatment, it is possible to prevent the extraneous light incident on the inside of the resin portion (convex lens) from reflecting on the lead frame. This reliably prevents the misrecognition that the lamp looks as if it were lighting during the unlit period.

In one embodiment of the present invention, the lead frame is fitted with a black resin located behind the light-emitting diode chip.

In the embodiment, the lead frame is fitted with the black resin located behind the light-emitting diode chip. So, contrast can be improved since the black resin constitutes the back surface of the light-emitting diode chip.

In one embodiment of the present invention, the resin portion constitutes a convex lens.

In the embodiment, the resin portion that constitutes the convex lens makes it possible to improve the luminous efficiency in the prescribed direction by concentrating the outgoing beam from the light-emitting diode chip in the prescribed direction (e.g., downward). This can be utilized for display.

In one embodiment of the present invention, the resin portion is molded with use of a resin that has photoabsorption bands at wavelengths other than a peak wavelength of light emitted from the light-emitting diode chip, and the resin constitutes a convex lens.

In the embodiment, the light having unnecessary wavelengths can be attenuated and therefore the display quality can be improved because the resin constituting the convex lens has photoabsorption bands at wavelengths other than the wavelength peak of the light emitted from the light-emitting diode chip.

In one embodiment of the present invention, an inner peripheral surface of a reflection cup that surrounds at least part of the light-emitting diode chip undergoes a black surface treatment.

In the light-emitting diode lamp of the embodiment, the inner peripheral surface of the reflection cup that has undergone the black surface treatment suppresses the reflection of extraneous light externally incident on the inside of the convex lens and therefore suppresses the radiation of the extraneous light out of the convex lens. Thus, it is possible to more reliably prevent the misrecognition that the lamp looks as if it were lighting during the unlit period.

As stated above, in the light-emitting diode lamp of the present invention, the directional characteristic peak of the light emitted from the resin portion, through which the light emitted from the light-emitting diode chip is transmitted, is not located on the extension axis in the direction in which the lead portion of the lead frame extends. That is, the directional characteristic peak of the outgoing beam deviates from the direction in which the lead portion extends. Therefore, the luminous efficiency in a prescribed direction can be improved by concentrating the outgoing beam from the light-emitting diode chip in the prescribed direction (e.g., downward), which can be utilized for display. Visibility can be improved by concentrating the light of the lamp downward, as an example, in the light-emitting diode lamp display device such as a road sign board or an emergency exit light which is installed above a human being.

In one embodiment of the present invention, a light-emitting diode display device comprises the above-stated light-emitting diode lamp.

In the light-emitting diode display device of this embodiment, it is possible to improve the luminous efficiency in the prescribed direction by concentrating the outgoing beam from the light-emitting diode chip in the prescribed direction (e.g., downward). This can be utilized for display. As an example, when the light-emitting diode lamp display device is used for a road sign board or an emergency exit light which is installed above a human being, the visibility can be improved by the downward concentration of the lamp light.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
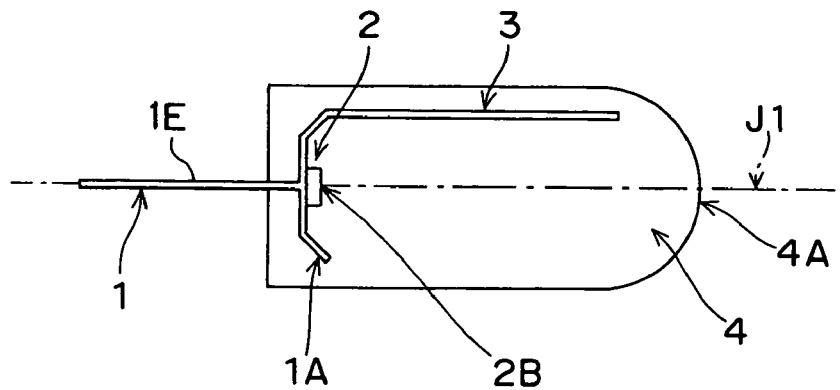
FIG. 1 is a sectional side view of a light-emitting diode lamp according to a first embodiment of the present invention.

The present invention will be described in detail below by the embodiments shown in the drawings.

FIRST EMBODIMENT

FIG. 1 shows a sectional view of the light-emitting diode lamp according to a first embodiment of the present invention viewed from a side. In the first embodiment, a light-emitting diode chip 2 is mounted on a cup-shaped mounting portion 1A of a lead frame 1. The mounting portion 1A is formed at one end in a direction in which a lead portion 1E of the lead frame 1 extends.

The light-emitting diode chip 2 and the mounting portion 1A are embedded in a resin-made convex lens 4 formed as a resin portion. Moreover, the lead frame 1 has a hood portion 3 served as a reflector. The hood portion 3 extends from the mounting portion 1A in a direction in which the lead portion 1E extends. The hood portion 3 is placed along an extension axis J1 in the direction in which the lead portion 1E extends and placed around the light-emitting diode chip 2. The hood portion 3 extends roughly parallel to the extension axis J1 above the extension axis J1 in FIG. 1. The hood portion 3 is not placed below the extension axis J1. Moreover, the hood portion 3 changes in size in the direction of the extension axis J1 around the extension axis J1.

At the time of using the light-emitting diode lamp, the perpendicular direction (normal line direction) to a light-emitting surface 2B of the light-emitting diode chip 2 is taken as a frontward direction of the light-emitting diode lamp. The directions parallel to the light-emitting surface 2B are taken as vertical and horizontal directions. During use of the light-emitting diode lamp, the hood portion 3 is located upward and not located downward.

Figure 4C:
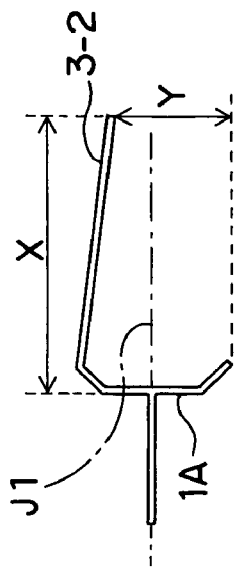
FIGS. 4B through 4D are views showing modifications of the hood portion of the cup-shaped mounting portion of the first embodiment.
Figure 4B:
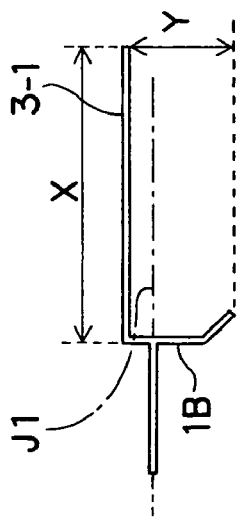
Figure 4A:
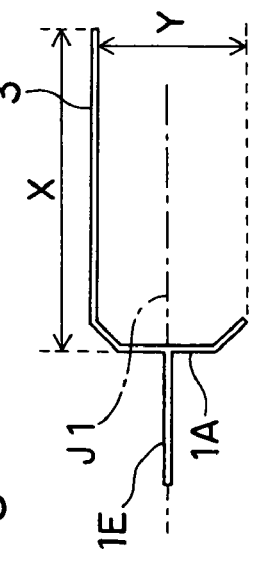
FIG. 4A is a view showing the configuration of the mounting portion of the first embodiment.

The shape of the hood portion 3 of the cup-shaped mounting portion 1A is described next with reference to FIG. 4A. The light-emitting diode chip 2 is omitted in FIG. 4A. The hood portion 3 extends parallel to the extension axis J1 as shown in FIG. 4A. The hood portion 3 has a dimension of X mm in the direction of the extension axis J1. Moreover, the mounting portion 1A has a dimension of Y mm in a direction perpendicular to the extension axis J1. The mounting portion 1A has a configuration symmetrical with respect to the extension axis J1.

In the one example shown in FIG. 4A, the dimensions of X mm and Y mm have a relation given as:

$$(Y/X) \geq \tan 5° = 0.087 \qquad \text{Eq. (1)}$$

On the assumption that the extraneous light with respect to the extension axis J1 (sunlight in the early morning or in the late afternoon when the irradiation angle is small) has an incident angle of about 5°, Equation (1) defines the dimensions of X mm and Y mm to prevent the extraneous light from being incident on and reflected on the mounting portion 1A by shielding the extraneous light with use of the hood portion 3.

Figure 2:
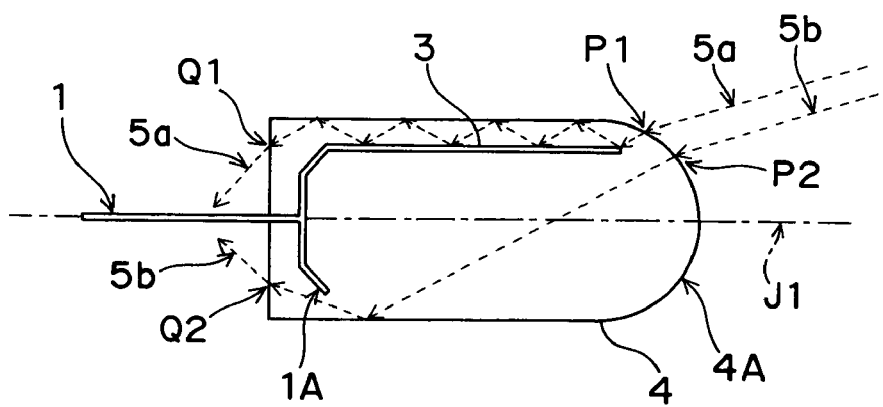
FIG. 2 is a view showing a state in which the extraneous light is refracted and reflected in the first embodiment.

FIG. 2 shows a state in which sunlight rays 5a and 5b in the early morning or in the late afternoon (west sun light), when the irradiation angle to the cup-shaped mounting portion 1A of the lead frame 1 is small, are incident on incident points P1 and P2 of the convex curved surface 4A of the convex lens 4 in the use of the light-emitting diode lamp in the first embodiment. In FIG. 2, the light-emitting diode chip 2 is omitted. In the one example shown in FIG. 2, the sunlight ray 5a exits backward from an emission point Q1 of the back surface of the convex lens 4 after repeating reflections between the peripheral surface of the convex lens 4 and the outer side surface of the hood portion 3 which is located in the upper portion of the mounting portion 1A constituting the reflection cup. On the other hand, the sunlight ray 5b incident on the lower side than the sunlight ray 5a does not fall on the mounting portion 1A of the lead frame 1, but exits backward from an emission point Q2 of the back surface of the convex lens 4, as shown in FIG. 2.

Therefore, according to the light-emitting diode lamp of the first embodiment, it is possible to avoid the frontward reflection of the incident extraneous light, and therefore to prevent the misrecognition due to the reflection of light which is attributed to the external incident light.

Figure 3:
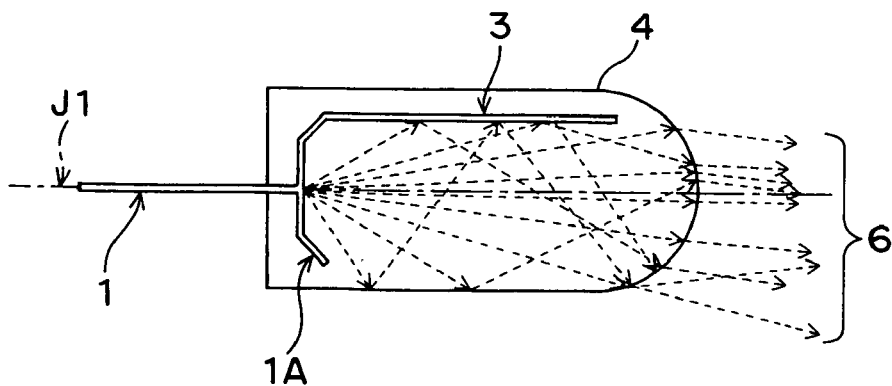
FIG. 3 is a view showing a state in which the outgoing beam is refracted and reflected in the first embodiment.

In the first embodiment, on the other hand, light rays 6 emitted from the light-emitting diode chip 2 in use are reflected on the hood portion 3 and the surface of the convex lens 4, as shown in FIG. 3. Thereby, the directional characteristic peak is not located on the extension axis J1, but the light rays 6 emitted from the convex lens 4 are concentrated downward. Therefore, the visibility from the lower side can be improved without any combination of complicated lens configurations.

Figure 19:
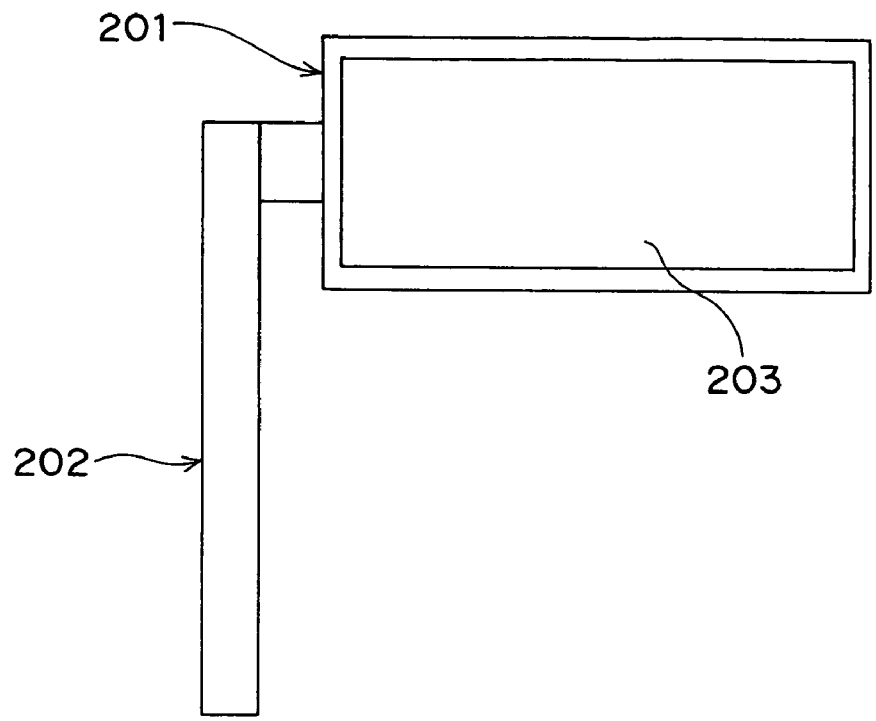
FIG. 19 is a view showing one example of the light-emitting diode display device as a road information board provided with any one of the light-emitting diode lamps of the first through ninth embodiments.
Figure 20:
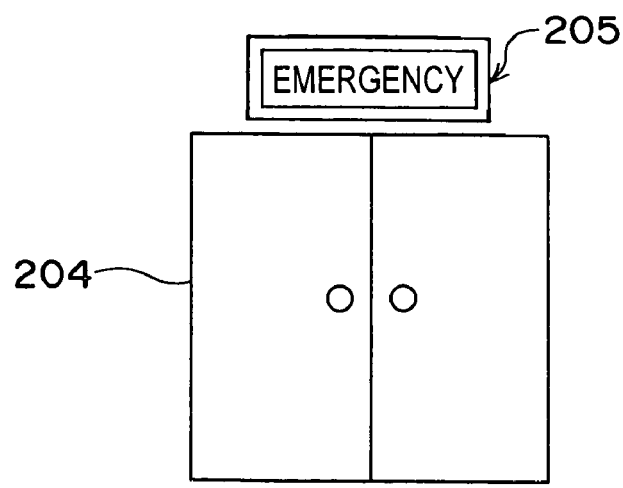
FIG. 20 is a view showing one example of the light-emitting diode display device as an emergency exit light provided with any one of the light-emitting diode lamps of the first through ninth embodiments.

Thus, when the light-emitting diode lamp of the first embodiment is used for an overhead type light-emitting diode lamp display device such as the road sign board 201 shown in FIG. 19 or the emergency exit light 205 shown in FIG. 20, the luminous efficiency is increased by the concentration of the lamp light rays on the lower side. This improves the visibility from the lower side of the screen 203 attached to the upper end of the pole 202.

Figure 4D:
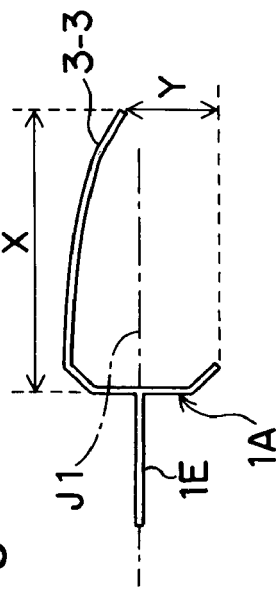

In this embodiment, as one example, the mounting portion 1A is symmetric with respect to the extension axis J1, as shown in FIG. 4A. However, it is acceptable to adopt a hood portion 3-1 as shown in FIG. 4B, in which a mounting portion 1B is asymmetric with respect to the extension axis J1 and the distance from the hood portion 3-1 to the extension axis J1 is shorter than that of the hood portion 3 of FIG. 4A. Moreover, it is acceptable to adopt a hood portion 3-2 as shown in FIG. 4C, in which the hood portion is inclined with respect to the extension axis J1 so as to come closer to the extension axis J1 from the mounting portion 1A toward the frontward end. Moreover, it is acceptable to adopt a curved hood portion 3-3 as shown in FIG. 4D, in which the hood portion comes closer to the extension axis J1 from the mounting portion 1A toward the frontward end. According to the hood portions 3-1 through 3-3 of FIGS. 4B through 4D, the light rays 6 emitted from the convex lens 4 can be further concentrated on the lower side than by the hood portion 3 of FIG. 4A, and thus the directivity can be intensified downward.

SECOND EMBODIMENT

Figure 5:
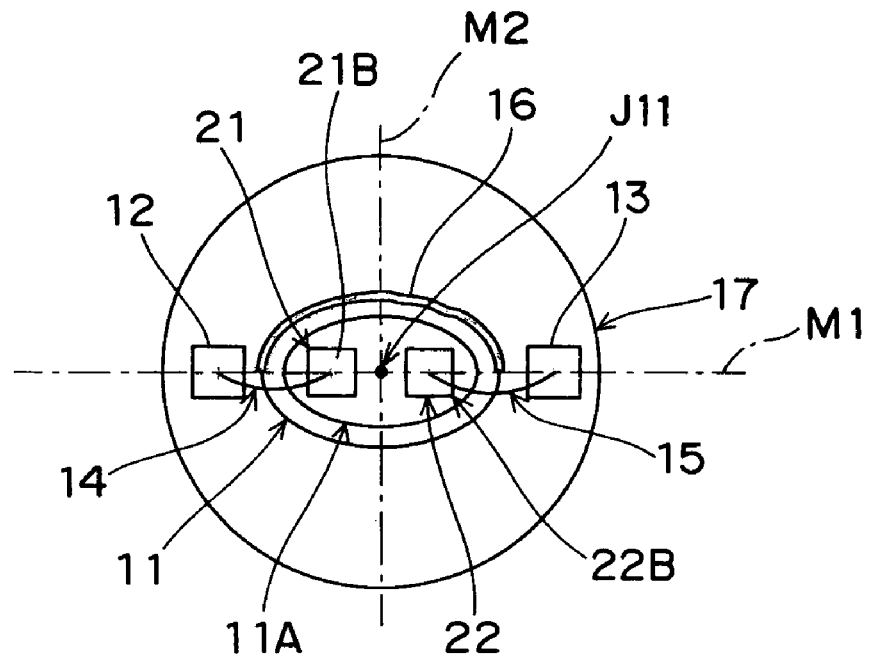
FIG. 5 is a front view of a light-emitting diode lamp according to a second embodiment of the present invention.
Figure 7:
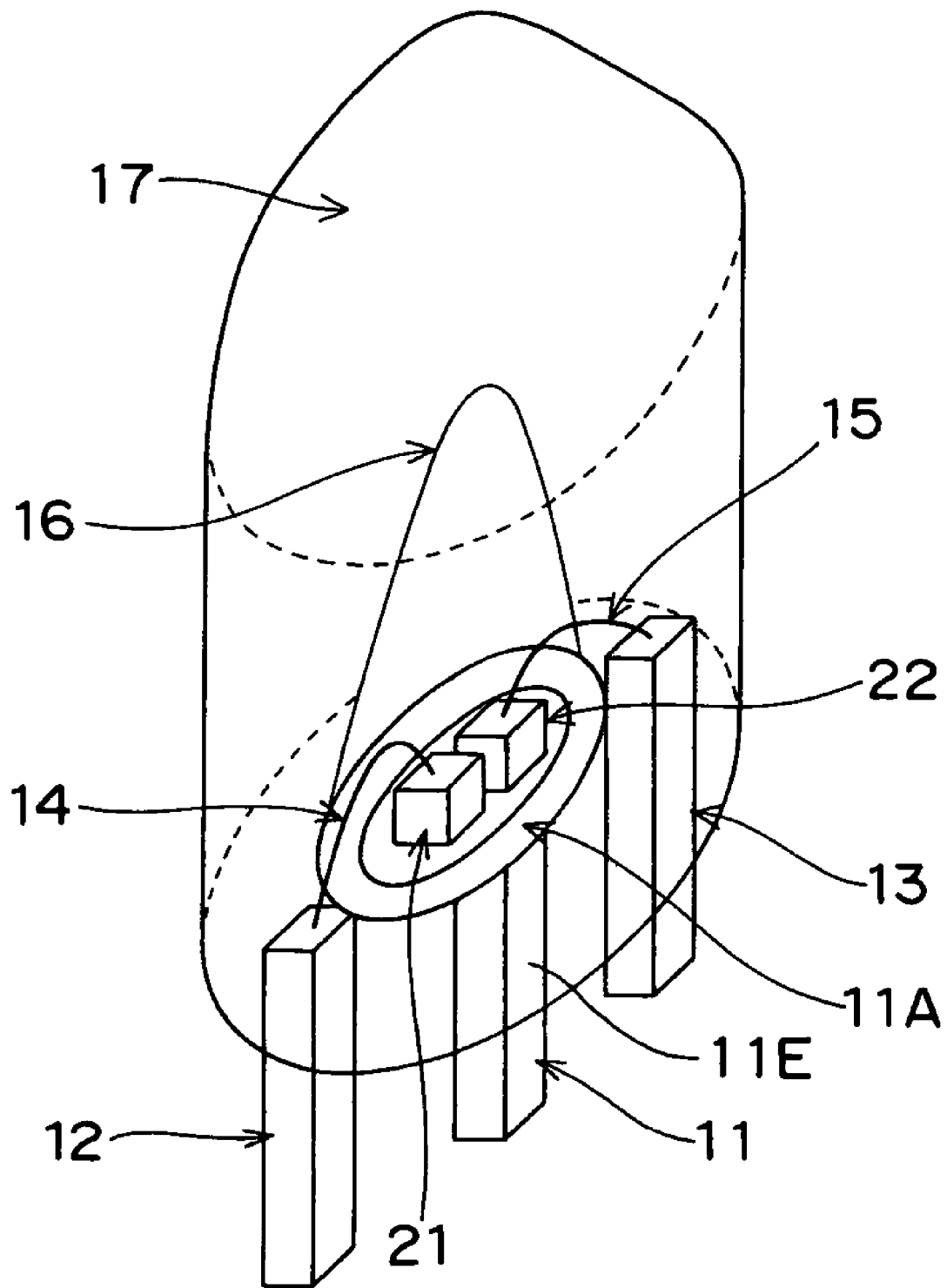
FIG. 7 is a perspective view of the light-emitting diode lamp according to the second embodiment of the present invention.

FIG. 5 shows a state in which a light-emitting diode lamp according to a second embodiment of the present invention is viewed from the front. FIG. 7 is a perspective view of the light-emitting diode lamp.

In the second embodiment, two light-emitting diode chips 21 and 22 are mounted on a mounting portion 11A of a lead frame 11. The two light-emitting diode chips 21 and 22 are connected to electrode leads 12 and 13 located on both sides of the lead frame 11 via connection wires 14 and 15, respectively.

As shown in FIG. 7, the mounting portion 11A and the two light-emitting diode chips 21 and 22 and the electrode leads 12 and 13 are embedded in the resin-made convex lens 17 as the resin portion. Moreover, the mounting portion 11A is formed at one end of a lead portion 11E of the lead frame 11.

The lead frame 11 has a hood portion 16 as a reflector. The hood portion 16 is placed along the extension axis J11 in the direction in which the lead portion 11E extends from the mounting portion 11A, and placed around the light-emitting diode chips 21 and 22. As shown in FIG. 5, the extension axis J11 penetrates the approximate center of the mounting surface of the mounting portion 11A (i.e. the approximate center between the light-emitting diode chips 21 and 22).

The dimension of the hood portion 16 in the direction of the extension axis J11 is changed around the extension axis J11, as shown in FIG. 7. More in detail, the hood portion 16 extends in the direction of the long axis of the mounting surface of the elliptic mounting portion 11A in such a way that the hood portion 16 faces the long axis over the approximately entire length of the long axis in the mounting surface. The hood portion 16 has a curved shape extending along approximately a half of the peripheral edge of the mounting surface of the mounting portion 11A. Moreover, as shown in FIG. 7, the dimension of the hood portion 16 in the direction of the extension axis J11 is maximized at in a portion of the hood portion 16 which intersects a vertical axis surface M2 shown in FIG. 5. The vertical axis M2 is perpendicular to the horizontal axis M1 that penetrates the centers of the respective light-emitting surfaces of the two light-emitting diode chips 21 and 22, and overlaps the extension axis J11.

The convex lens 17 has a convex configuration in the light-emitting direction of the two light-emitting diode chips 21 and 22, as shown in FIG. 7. At the time of using the light-emitting diode lamp, a direction perpendicular to the light-emitting surfaces 21B and 22B of the light-emitting diode chips 21 and 22 is taken as the frontward direction, and the direction of the vertical axis M2 parallel to the light-emitting surfaces 21B and 22B is taken as the vertical direction.

Therefore, when the light-emitting diode lamp of the second embodiment is used, the hood portion 16 is located upwardly of the light-emitting diode chips 21 and 22. The light-emitting diode chips 21 and 22 are arranged in the horizontal direction with the hood portion 16 located upward.

According to the second embodiment, as in the case of the first embodiment, external incident light of the west sun or the like is shielded by the hood portion 16 during use of the light-emitting diode lamp. Thereby, it is possible for the light not to be incident on the light-emitting diode chips 21 and 22. This prevents the misrecognition that the light-emitting diode chips 21 and 22 look as if they are lighting, which misrecognition is attributed to the external incident light.

When the light-emitting diode lamp of the second embodiment is used for an overhead type light-emitting diode lamp display device 201 such as the road sign board 201 shown in FIG. 19 or the emergency exit light 205 shown in FIG. 20, the hood portion 16 reflects the outgoing beams from the light-emitting diode chips 21 and 22 downwardly. Therefore, the luminous efficiency in the downward direction is improved by concentrating the outgoing beams downward without any combination of complicated lens configurations. Thus, the visibility from the lower side of the screen 203 is improved.

Furthermore, in the second embodiment, a multicolor lighting type of light-emitting diode lamp can be obtained by using a red light-emitting diode as the light-emitting diode chip 21 and using a green light-emitting diode as the light-emitting diode chip 22, for example. It is a matter of course that the combination of the colors of lighting of the light-emitting diode chips 21 and 22 is not limited to red and green colors. It is also acceptable to adopt a combination of red and blue colors, a combination of yellow and green colors and so on. When the two light-emitting diode chips 21 and 22 emit same color, luminance is improved. Although the two light-emitting diode chips are provided in the second embodiment, it is acceptable to provide two or more light-emitting diode chips.

THIRD EMBODIMENT

Figure 6:
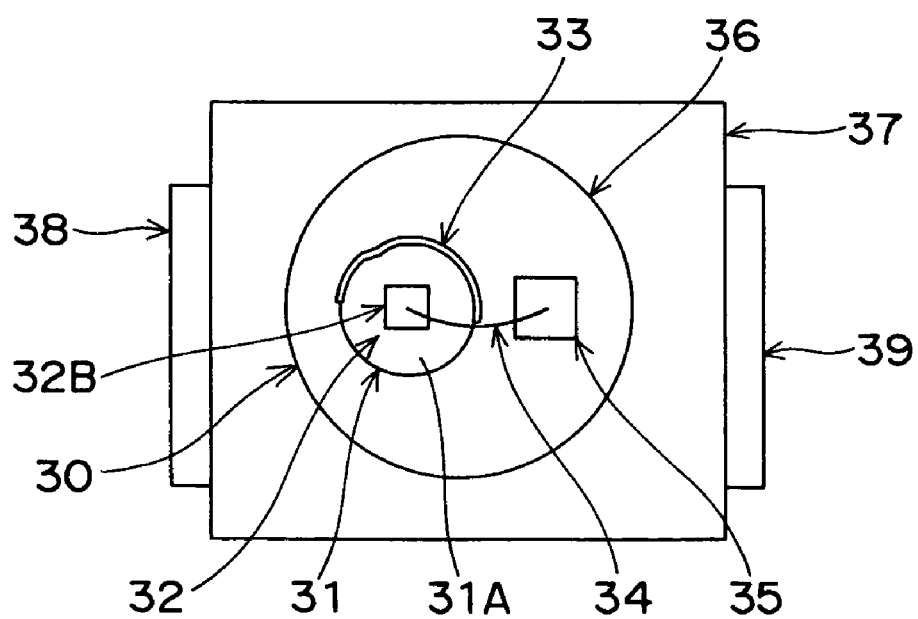
FIG. 6 is a front view of a light-emitting diode lamp according to a third embodiment of the present invention.

FIG. 6 shows a state in which the light-emitting diode lamp according to a third embodiment of the present invention is viewed from the front side.

In the third embodiment, the light-emitting diode lamp has a light-emitting diode chip 32 which is mounted on a mounting surface 31A of a mounting portion 31 of a lead frame 30. The light-emitting diode chip 32 is connected to the electrode lead 35 via a connection wire 34. The lead frame 30 has a lead portion (not shown). The lead portion extends depthwise in the normal line direction of the mounting surface 31A of the mounting portion 31 (i.e. in the rearward direction of the sheet of paper).

The mounting portion 31 of the lead frame 30, the light-emitting diode chip 32 and the electrode lead 35 are embedded in a resin-made convex lens 36 as a resin portion. The convex lens 36 has a convex configuration in the light-emitting direction of the light-emitting diode chip 32 (i.e. in the frontward direction of the sheet of paper). The convex lens 36 is placed on a resin-made main body portion 37. Terminals 38 and 39 for connection to a printed wiring board (not shown) are arranged on both sides of the main body portion 37. The connection terminal 38 is electrically connected to the lead frame 30. The connection terminal 39 is electrically connected to the electrode lead 35.

In the third embodiment, a hood portion 33 is provided as a reflector. The hood portion 33 extends from the outer edge of the mounting surface 31A of the mounting portion 31 toward the normal line direction of the mounting surface 31A (i.e. the direction in which the lead portion extends). The hood portion 33 extends along approximately a half of the outer peripheral edge of the mounting surface 31A. The hood portion 33 is arranged around the center axis of the light-emitting surface 32B of the light-emitting diode chip 32 (i.e. around the extension axis in the direction in which the lead portion extends).

When the light-emitting diode lamp of the third embodiment is used, a direction perpendicular to the light-emitting surface 32B of the light-emitting diode chip 32 is taken as the frontward direction. Also, a direction parallel to the light-emitting surface 32B is taken as the vertical direction. The hood portion 33 is located upward in the use of the light-emitting diode lamp.

According to the third embodiment, therefore, external incident light of the west sun or the like is shielded by the hood portion 33, as in the case of the first embodiment. Thus, it is possible for the light not to be incident on the light-emitting diode chip 32. This prevents the misrecognition that the light-emitting diode chip 32 looks as if it were lighting due to the external incident light during the unlit period.

In the third embodiment, also, the light-emitting diode lamp should preferably be adopted to an overhead type light-emitting diode lamp display device such as the road sign board 201 shown in FIG. 19 or the emergency exit light 205 shown in FIG. 20. In this case, the hood portion 33 reflects the outgoing beam from the light-emitting diode chip 32 downwardly. Therefore, the luminous efficiency in the downward direction can be improved by concentrating the outgoing beam downward without any combination of complicated lens configurations, and the visibility from the lower side can be improved.

In the third embodiment, the surface mount type light-emitting diode lamp is formed by mounting a resin-made convex lens 36, where the light-emitting diode chip 32 is embedded, on the upper surface of the resin-made main body portion 37. It is also possible to use a light-emitting diode lamp of a type such that a convex lens is built in the resin-made main body portion 37. Moreover, the diode lamp may also be a light-emitting diode lamp of a type such that the resin-made convex lens 36 penetrates the upper surface of the main body portion 37.

FOURTH EMBODIMENT

A fourth embodiment of the present invention is described as a modification of the second embodiment shown in FIGS. 5 and 7.

In the fourth embodiment, the resin-made convex lens 17 of the second embodiment is a convex lens made of epoxy resin. More specifically, the epoxy resin of the fourth embodiment is mixed with a pigment that transmits light of specified wavelengths (e.g., the wavelengths corresponding to green and red colors) and attenuates the light of wavelengths other than the specified wavelength. In the case of the fourth embodiment, for example, when the light-emitting diode chip 21 emits red light and the light-emitting diode chip 22 emits green light, it becomes possible to attenuate the radiation of practically unnecessary light and thereby to further improve the display quality.

It is acceptable to mix the epoxy resin, which constitutes the convex lens 17, with a pigment that has photoabsorption bands of other wavelengths than those corresponding to the green and red colors. In this case, the epoxy resin absorbs and attenuates the light of unnecessary wavelengths other than the green and red colors. Thereby, the display quality is improved. The convex lens 17 may be constituted of a resin other than epoxy resin. When the pigment is not mixed with the resin, the pigment may be applied to the surface of the convex lens 17. Furthermore, the surface of the convex lens 17 may be covered with a coat mixed with the pigment.

FIFTH EMBODIMENT

Figure 8:
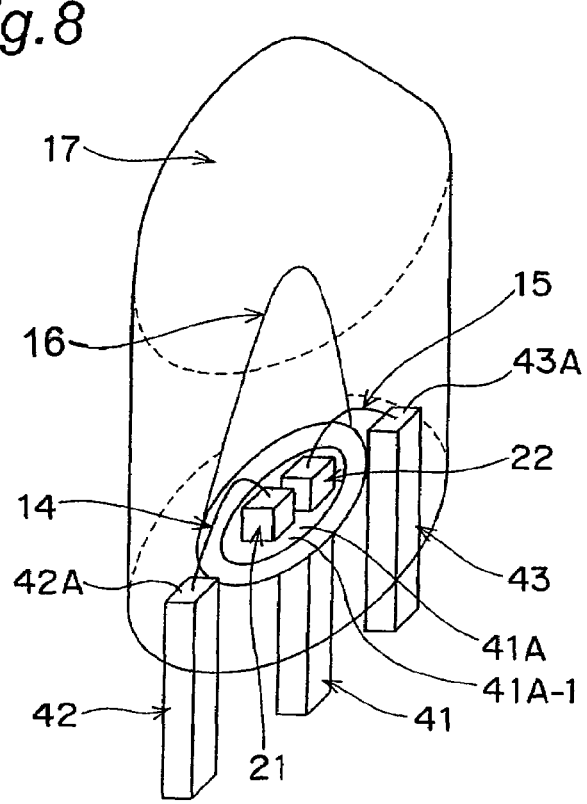
FIG. 8 is a perspective view of a light-emitting diode lamp according to a fifth embodiment of the present invention.

FIG. 8 shows a light-emitting diode lamp according to a fifth embodiment of the present invention. The fifth embodiment differs from the second embodiment only in that a lead frame reception lens 41 and electrode leads 42 and 43 are replaced with the lead frame 11 and the electrode leads 12 and 13 of the light-emitting diode lamp of the second embodiment shown in FIGS. 5 and 7.

In the fifth embodiment, the optical reflectance of the mounting surface 41A-1 of the mounting portion 41A is set to 80% or less by conducting a black surface treatment to the mounting surface 41A-1 of the mounting portion 41A of the lead frame 41. Also, the reflectances of light of the end surfaces 42A and 43A are each set to 80% or less by conducting the black surface treatment to the end surfaces 42A and 43A of the electrode leads 42 and 43.

The light-emitting diode chips 21 and 22 are mounted on the mounting surface 41A-1. The light-emitting diode chip 22 is connected to the end surface 42A of the electrode lead 42 via a connection wire 14. Moreover, the light-emitting diode chip 22 is connected to the end surface 43A of the electrode lead 43 via a connection wire 15.

In the fifth embodiment, the extraneous light externally incident on the inside of the convex lens 17 can be prevented from reflecting on the mounting surface 41A-1 and the end surfaces 42A and 43A because the optical reflectances of the mounting surface 41A-1 of the mounting portion 41A and the end surfaces 42A and 43A are each set to 80% or less.

Thus, it is suppressed for the extraneous light incident on the inside of the convex lens 17 to be radiated out of the convex lens 17. This makes it possible to reliably prevent the misrecognition that the lamp looks as if it were lighting. In the fifth embodiment, the optical reflectances of the mounting surface 41A-1 of the mounting portion 41A and the end surfaces 42A and 43A are set to 80% or less by the black surface treatment because the reflection suppressing effect becomes insufficient when the reflectance exceeds 80%.

SIXTH EMBODIMENT

Figure 9:
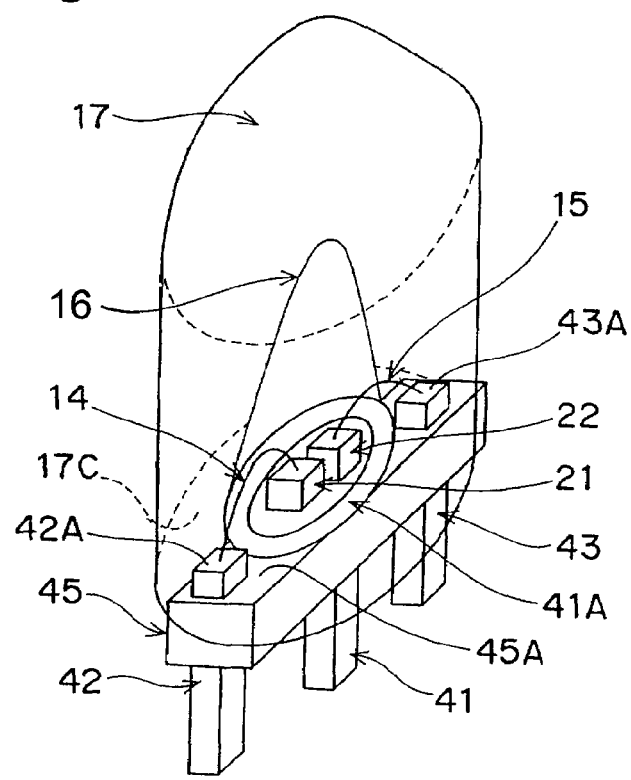
FIG. 9 is a perspective view of a light-emitting diode lamp according to a sixth embodiment of the present invention.

FIG. 9 shows a light-emitting diode lamp according to a sixth embodiment of the present invention. The light-emitting diode lamp of the sixth embodiment differs from that of the fifth embodiment only in a black resin portion 45. The black resin portion 45 extends from the inside to the outside of the convex lens 17 penetrating through a bottom surface 17C of the convex lens 17. The black resin portion 45 is located in a position retreated from the mounting surface 41A-1 of the lead frame 41 and the end surfaces 42A and 43A of the electrode leads 42 and 43 by a prescribed dimension in a direction opposite to the light-emitting direction.

The black resin portion 45 is embedded in the bottom surface 17C of the convex lens 17 and located inside and outside the bottom surface 17C around the peripheries of the mounting surface 41A-1 of the lead frame 41 and the end surfaces 42A and 43A of the electrode leads 42 and 43. The black resin portion 45 has a roughly cubic configuration as a whole.

In the sixth embodiment, a black front surface 45A of the black resin portion 45 contacts the back surface of the mounting surface 41A-1 of the lead frame 41, the end surface 42A of the electrode lead 42 and the end surface 43A of the electrode lead 43. Thus, contrast can be improved in the sixth embodiment.

SEVENTH EMBODIMENT

Figure 10:
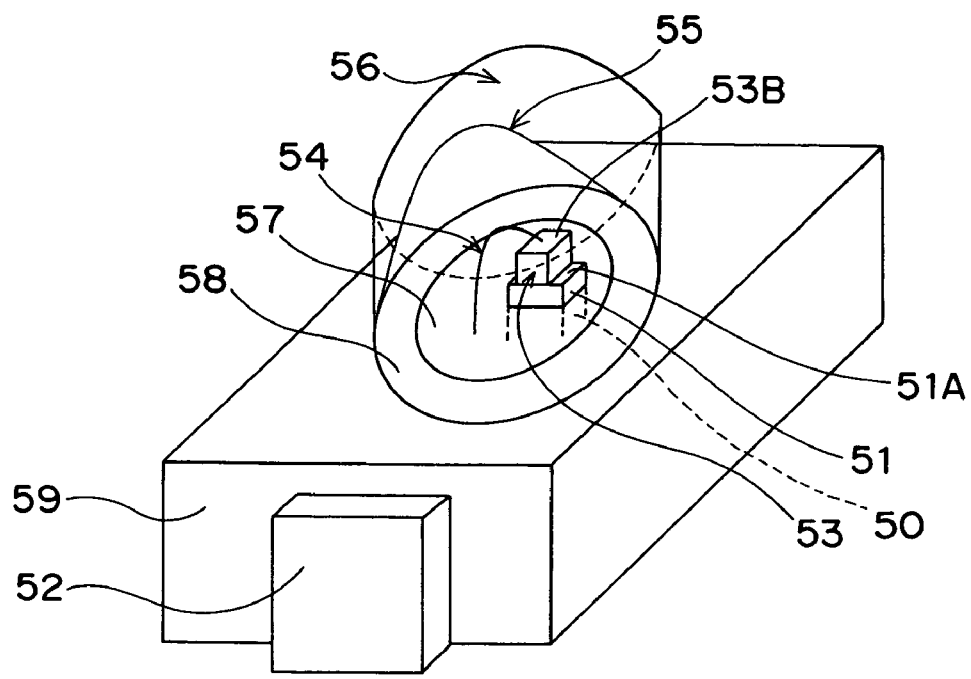
FIG. 10 is a perspective view of a light-emitting diode lamp according to a seventh embodiment of the present invention.
Figure 11:
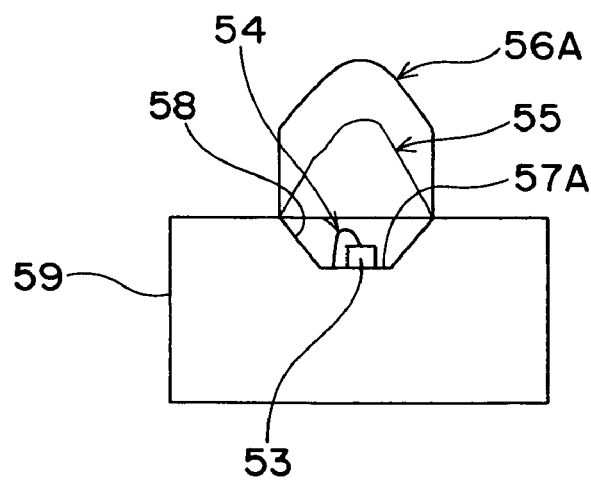
FIG. 11 is a sectional view of the seventh embodiment.

FIG. 10 shows a light-emitting diode lamp according to a seventh embodiment of the present invention. In the seventh embodiment, a light-emitting diode chip 53 is mounted on the mounting surface of a mounting portion 51A of a lead frame 51. The light-emitting diode chip 53 is connected to an electrode lead 52 via a connection wire 54. The electrode lead 52 extends in a bending form from the bottom surface to a side surface of a resin-made main body 59. The lead frame 51 has a lead portion 50. A mounting portion 51A is formed at one end of the lead portion 50 in the direction in which the lead portion 50 extends. The extension direction is the same as the normal line direction of the mounting surface of the mounting portion 51A. Moreover, the light-emitting diode chip 53 is embedded in a resin-made convex lens 56 as a resin portion. As shown in FIG. 11, the convex lens 56 includes a curved surface 56A that has a convex configuration toward the light-emitting direction of the light-emitting diode chip 53.

Moreover, a hood portion 55 as a reflector is formed at the periphery of the convex lens 56. The hood portion 55 is placed along the extension axis (optical axis of a light-emitting surface 53B of the light-emitting diode chip 53) in a direction in which the lead portion 50 extends. Moreover, the dimension of the hood portion 55 in the direction of the extension axis thereof changes around the extension axis. The dimensional change of the hood portion 55 in the direction of the extension axis shows gradual reduction from the peak toward the base.

At the time of using the light-emitting diode lamp, a direction perpendicular to the light-emitting surface 53B of the light-emitting diode chip 53 is taken as the frontward direction. A direction which is parallel to the light-emitting surface 53B and in which the hood portion 55 is located is taken as the vertical direction. According to the seventh embodiment, the hood portion 55 serves as a reflector and shields the external incident light of the west sun or the like which directs toward the light-emitting diode chip 53 in use, as in the cases of first through sixth embodiments. Therefore, it is possible to prevent the misrecognition that the light-emitting diode chip 53 looks as if it were lighting due to the extraneous light during unlit period.

In the seventh embodiment, as shown in FIG. 11, the light-emitting diode chip 53 is placed on a bottom surface 57A in a conical hollow 57 of the resin-made main body 59. A peripheral wall surface 58 constitutes a reflection cup of the hollow 57. The peripheral wall surface 58 and the hood portion 55 are subjected to black surface treatment so as to have an optical reflectance of not greater than 80%. The peripheral wall 58 is expanded in diameter and tapered toward the light-emitting direction of the light-emitting diode chip 53. The black peripheral wall 58 suppresses the reflection of extraneous light externally incident on the inside of the convex lens 56, and therefore suppresses the radiation of the extraneous light outwardly of the convex lens 56. Thus, it is possible to more reliably prevent the misrecognition that the lamp looks as if it were lighting due to the extraneous light during unlit period.

In the seventh embodiment, the reflectances of the hood portion 55 and the peripheral wall 58 are set to 80% or less by the black surface treatment because the suppression of reflection becomes insufficient when the reflectance exceeds 80%.

It is also possible to provide a light-emitting diode display device that displays information of patterns, symbols, letters and so on by arranging the light-emitting diode lamps of the first through seventh embodiments in a matrix form. According to the light-emitting diode display device, the misrecognition attributed to the extraneous light can be suppressed as described above.

EIGHTH EMBODIMENT

Figure 12:
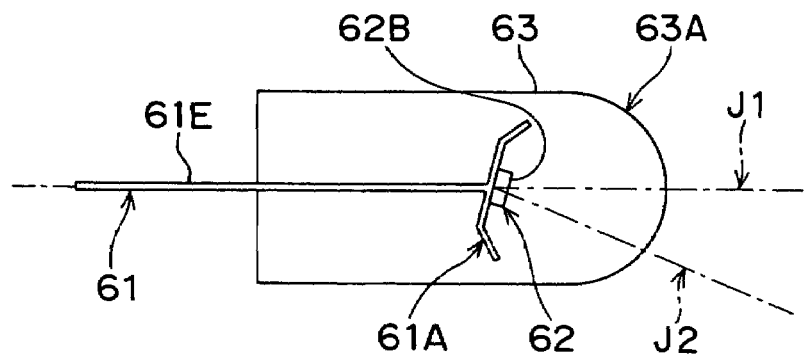
FIG. 12 is a sectional side view of a light-emitting diode lamp according to an eighth embodiment of the present invention.

FIG. 12 is a side view of a light-emitting diode lamp according to an eighth embodiment.

The light-emitting diode lamp of the eighth embodiment includes a lead frame 61. The lead frame 61 has a lead portion 61E and a mounting portion 61A. The mounting portion 61A is formed at one end of the lead portion 61E in a direction in which the lead portion 61E extends. The mounting portion 61A has a cup-like configuration. A light-emitting diode chip 62 is mounted on the mounting portion 61A. The light-emitting diode chip 62 is embedded in a resin-made convex lens 63. As shown in FIG. 12, the convex lens 63 has a curved surface 63A.

The mounting portion 61A of the lead frame 61 is inclined with respect to the lead portion 61E. That is, a normal line J2 of the mounting surface of the mounting portion 61A (i.e. a normal line of a chip light-emitting surface 62B) is inclined with respect to the extension axis J1 of the lead portion 61E of the lead frame 61. At the time of using the light-emitting diode lamp, the extension axis J1 of the lead frame 61 is taken as the frontward direction, and the chip mounting portion 61A is inclined downward.

Figure 13:
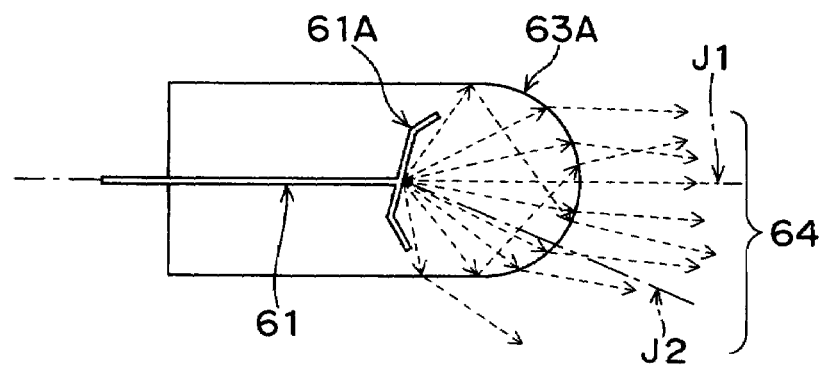
FIG. 13 is a view showing a state in which the outgoing beam is refracted and reflected in the eighth embodiment.

According to the eighth embodiment, the chip mounting portion 61A and the chip light-emitting surface 62B are inclined downward during use. Therefore, as shown in FIG. 13, outgoing beams 64 emitted from the light-emitting diode chip 62 go out of the convex lens 63 to be concentrated downward. That is, the directional characteristic peak of the outgoing beams 64 is below the extension axis J1.

Therefore, when the light-emitting diode lamp of the eighth embodiment is provided in a light-emitting diode lamp display device such as an emergency exit light which is installed above a human being, the luminous efficiency in the downward direction is increased because the light rays of the lamp are concentrated in the downward direction without any combination of complicated lens configurations. This makes it possible to improve the visibility from the lower side.

NINTH EMBODIMENT

Figure 14:
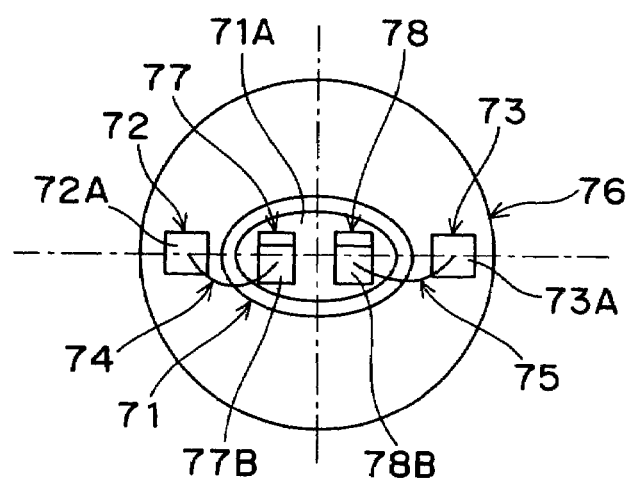
FIG. 14 is a front view of a light-emitting diode lamp according to a ninth embodiment of the present invention.
Figure 15:
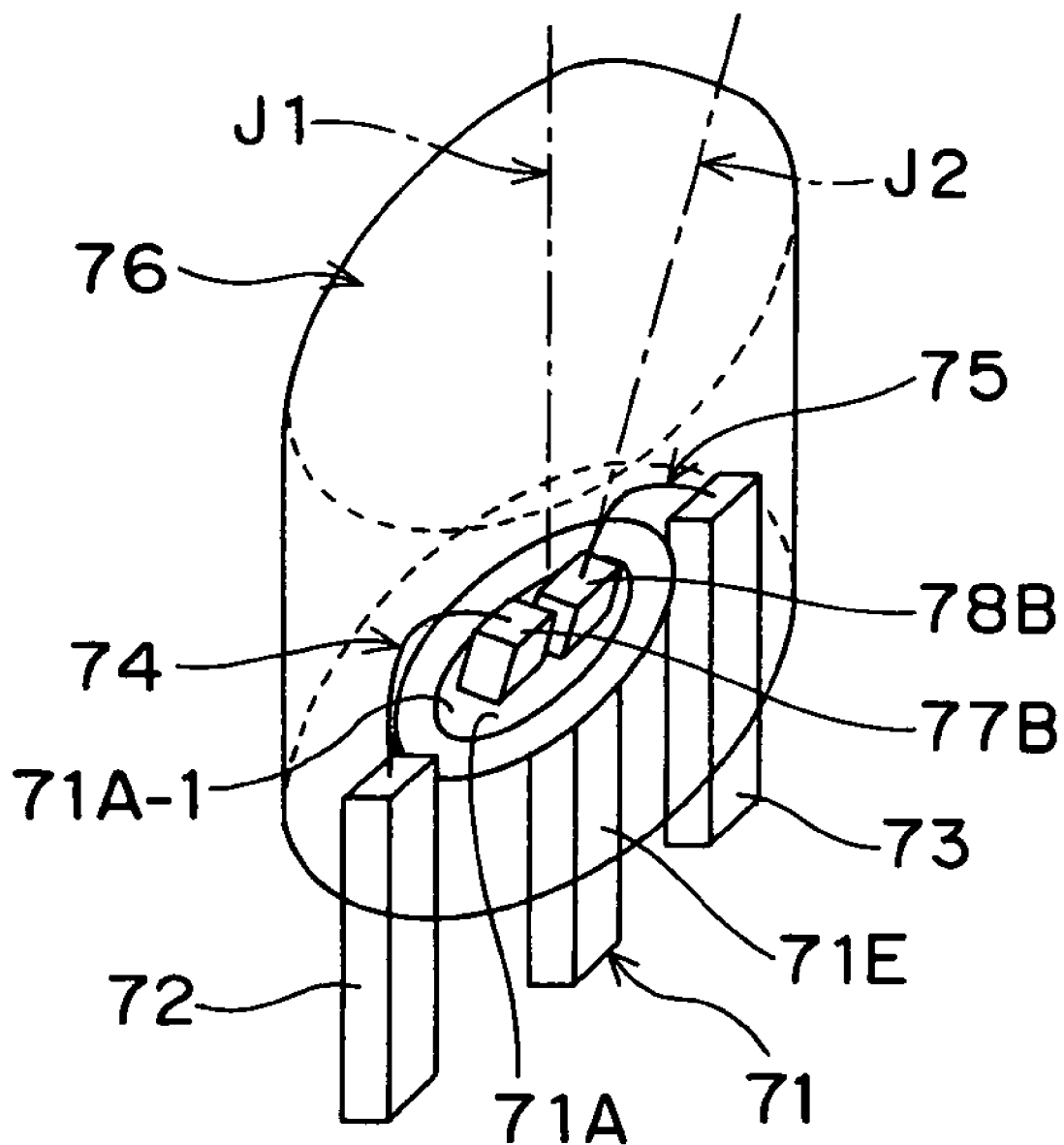
FIG. 15 is a perspective view of the light-emitting diode lamp according to the ninth embodiment of the present invention.
Figure 16:
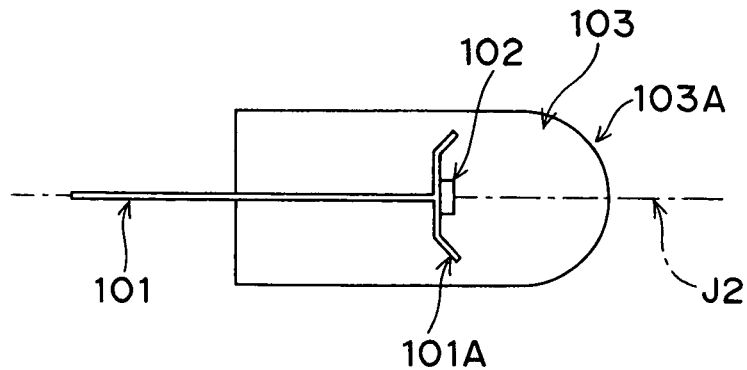
FIG. 16 is a sectional side view of a conventional light-emitting diode lamp.
Figure 17:
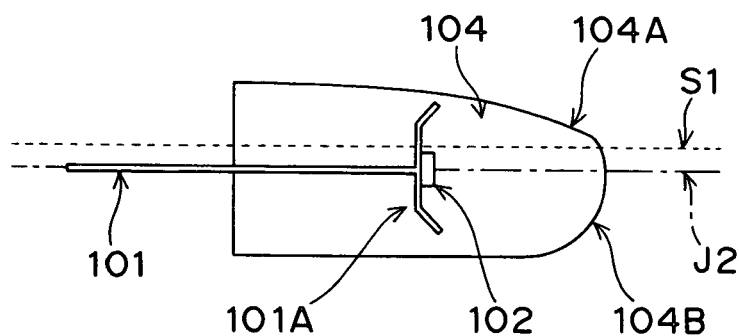
FIG. 17 is a sectional side view of another conventional light-emitting diode lamp.
Figure 18:
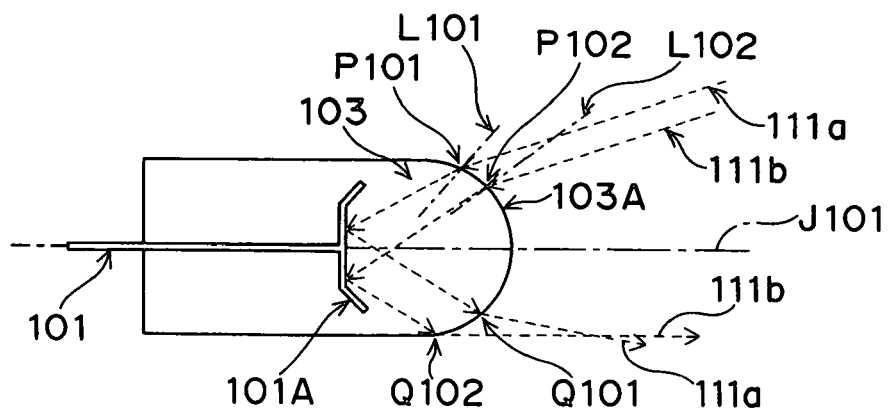
FIG. 18 is a view showing a state in which the extraneous light is refracted and reflected in the conventional light-emitting diode lamp of FIG. 15.

FIG. 14 is a front view of a light-emitting diode lamp of a ninth embodiment. FIG. 15 is a perspective view of the light-emitting diode lamp of the ninth embodiment.

In the ninth embodiment, two light-emitting diode chips 77 and 78 are mounted on a mounting surface 71A-1 of a mounting portion 71A of a lead frame 71. The two light-emitting diode chips 77 and 78 are connected to electrode leads 72 and 73 located on both sides of the lead frame 71 via connection wires 74 and 75, respectively.

As shown in FIG. 15, the lead frame 71 has a lead portion 71E, and the mounting portion 71A is formed at one end of the lead portion 71E in a direction in which the lead portion 71E extends. In FIG. 14, the direction in which the lead portion extends is the direction perpendicular to the sheet of paper. The mounting surface 71A-1 of the mounting portion 71A is inclined with respect to the extension axis J1 which is in the direction of the lead portion 71E. Therefore, the normal lines of the light-emitting surfaces 77B and 78B of the two light-emitting diodes chips 77 and 78 are inclined with respect to the extension axis J1 of the lead portion 71E. In FIG. 15, the normal line of the light-emitting surface 78B of the light-emitting diode chip 78 is indicated by a reference numeral J2.

In this embodiment, the mounting portion 71A, the two light-emitting diode chips 77 and 78 and the electrode leads 72 and 73 are embedded in a resin-made convex lens 76 as a resin portion. The convex lens 76 has a convex configuration toward the light-emitting direction of the two light-emitting diode chips 77 and 78.

At the time of using the light-emitting diode lamp, a direction perpendicular to the end surfaces 72A and 73A of the electrode leads 72 and 73 (i.e. the direction in which the electrode leads 72 and 73 extend, in other words, the frontward direction perpendicular to the sheet of paper of FIG. 14) is taken as the frontward direction. Also, directions parallel to the end surfaces 72A and 73A of the electrode leads 72 and 73 are taken as the vertical and horizontal directions. The direction in which the chip mounting portion 71A is inclined is taken as the downward direction. Thus, the two light-emitting diode chips 77 and 78 are arranged in the horizontal direction on the mounting portion 71A which is inclined in the downward direction. In other words, the two light-emitting diode chips are arranged in the direction perpendicular to a plane which contains the extension axis of the lead portion and parallel lines of the normal lines of the light-emitting diode chips.

Therefore, when the light-emitting diode lamp of the ninth embodiment is provided in the light-emitting diode lamp display device such as an emergency exit light which is installed above a human being, the luminous efficiency in the downward direction is increased because the light rays of the lamp is concentrated in the downward direction without any combination of complicated lens configurations. This makes it possible to improve the visibility from the lower side.

In the ninth embodiment, a light-emitting diode lamp of multicolor lighting is realized, for example, by using the light-emitting diode chip 77 as a red light-emitting diode and using the light-emitting diode chip 78 as a green light-emitting diode. It is a matter of course that the combination of lighting colors in the light-emitting diode chips 77 and 78 is not limited to the combination of the red and green colors. It is also acceptable to combine red and blue colors, yellow and green colors and so on. Moreover, when the two light-emitting diode chips 77 and 78 have same color, luminance can be improved. Although the two light-emitting diode chips are provided in the ninth embodiment, it is acceptable to provide three or more light-emitting diode chips.

TENTH EMBODIMENT

A tenth embodiment is a modification of the ninth embodiment. In the tenth embodiment, an epoxy resin convex lens is used as a resin-made convex lens 76 stated in the ninth embodiment. Then, the epoxy resin is mixed with a pigment which transmits light of specified wavelengths (e.g., the wavelengths corresponding to green and red colors) and which attenuates the light of wavelengths other than the specified wavelengths.

In the tenth embodiment, for example, when the light-emitting diode chip 77 emits red light and the light-emitting diode chip 78 emits green light, it becomes possible to attenuate the radiation of practically unnecessary light and further improve the display quality.

The epoxy resin that constitutes the convex lens 76 may be mixed with a pigment that has photoabsorption bands of other wavelengths than those corresponding to the green and red colors. In this case, the epoxy resin absorbs and attenuates the light of unnecessary wavelengths other than the green and red colors, and therefore the display quality can be improved. The convex lens 76 may be constituted of a resin other than epoxy resin. Also, the pigment may be applied to the surface of the convex lens 76 when it is unable to be mixed with the resin. Further, it is acceptable to cover the surface of the convex lens 76 with a cover mixed with the pigment.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

The invention claimed is:

1. A light-emitting diode lamp comprising:
   a lead frame having a lead portion and a mounting portion formed at one end of the lead portion in a direction in which the lead portion extends;
   a light-emitting diode chip mounted on the mounting portion;
   a reflector configured to be asymmetric about an optical axis of the light-emitting diode chip and having an extension portion, offset from an extension axis of the lead portion, and extending along the extension axis of the lead portion, wherein a distance of the offset from the extension axis of the lead portion is less than a length of the extension portion along the extension axis of the lead portion; and
   a resin portion, encapsulating the light-emitting diode chip and the reflector, through which light emitted from the light-emitting diode chip is transmitted, wherein
   a directional characteristic peak of an outgoing beam emitted from the resin portion is not located on the extension axis of the lead portion in the direction in which the lead portion extends.

2. The light-emitting diode lamp as claimed in claim 1, wherein the reflector is configured such that its dimension in the direction of the extension axis is changed around the extension axis.

3. The light-emitting diode lamp as claimed in claim 2, wherein
   the lamp has a plurality of light-emitting diode chips, and
   the plurality of light-emitting diode chips are each arranged along a direction in which the reflector extends around the extension axis.

4. The light-emitting diode lamp as claimed in claim 1, wherein the lamp has a plurality of light-emitting diode chips, and the plurality of light-emitting diode chips are arranged in a direction perpendicular to a plane that contains the extension axis of the lead portion and a parallel line of the normal line of the light-emitting surface of the light-emitting diode chip.

5. The light-emitting diode lamp as claimed in claim 4, wherein the lead frame undergoes a black surface treatment.

6. The light-emitting diode lamp as claimed in claim 1, wherein the lead frame undergoes a black surface treatment.

7. The light-emitting diode lamp as claimed in claim 1, wherein the lead frame is fitted with a black resin located behind the light-emitting diode chip.

8. The light-emitting diode lamp as claimed in claim 1, wherein the resin portion constitutes a convex lens.

9. The light-emitting diode lamp as claimed in claim 1, wherein the resin portion is molded with use of a resin that has a photoabsorption band at wavelengths other than a peak wavelength of light emitted from the light-emitting diode chip, and the resin constitutes a convex lens.

10. The light-emitting diode lamp as claimed in claim 1, wherein an inner peripheral surface of the reflector undergoes a black surface treatment.

11. A light-emitting diode display device comprising the light-emitting diode lamp claimed in claim 1.

* * * * *